(12) United States Patent
Matsumoto et al.

(10) Patent No.: US 6,883,157 B2
(45) Date of Patent: Apr. 19, 2005

(54) BWB TRANSMISSION WIRING DESIGN SYSTEM

(75) Inventors: Hideaki Matsumoto, Kawasaki (JP); Yasuhiro Teshima, Kawasaki (JP); Akira Okada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 93 days.

(21) Appl. No.: 10/299,334

(22) Filed: Nov. 19, 2002

(65) Prior Publication Data

US 2003/0217349 A1 Nov. 20, 2003

(30) Foreign Application Priority Data

May 20, 2002 (JP) ....................................... 2002-144756

(51) Int. Cl.$^7$ ............................................. G06F 17/50
(52) U.S. Cl. ............................. 716/15; 716/12; 716/13; 716/14
(58) Field of Search .......................... 716/4–6, 12–15; 714/724–725, 736–737; 700/95–97

(56) References Cited

U.S. PATENT DOCUMENTS

| | | | |
|---|---|---|---|
| 5,410,551 A | * | 4/1995 | Edwards et al. ............ 714/736 |
| 5,436,846 A | * | 7/1995 | Fleming-Dahl ................ 716/4 |
| 6,099,581 A | | 8/2000 | Sakai |
| 6,304,790 B1 | * | 10/2001 | Nakamura et al. ............ 700/97 |
| 6,546,528 B1 | * | 4/2003 | Sasaki et al. .................... 716/5 |
| 6,557,154 B1 | * | 4/2003 | Harada et al. ................. 716/11 |
| 6,629,296 B1 | * | 9/2003 | Ganesan et al. ................ 716/5 |
| 6,662,353 B1 | * | 12/2003 | Yamamoto et al. ........... 716/14 |
| 2002/0188910 A1 | * | 12/2002 | Zizzo ............................. 716/1 |
| 2003/0009727 A1 | * | 1/2003 | Takeyama et al. .............. 716/1 |

FOREIGN PATENT DOCUMENTS

| | | |
|---|---|---|
| JP | 6-18619 | 1/1994 |
| JP | 8-297689 | 11/1996 |
| JP | 9-274623 | 10/1997 |
| JP | 10-92938 | 4/1998 |

* cited by examiner

Primary Examiner—Thuan Do
Assistant Examiner—Naum Levin
(74) Attorney, Agent, or Firm—Katten Muchin Zavis Rosenman

(57) ABSTRACT

The present invention relates to a BWB wiring design system, and provides a BWB transmission wiring design system capable of guaranteeing the super high-speed operation of a system composed of a BWB and a plurality of printed circuit boards mounted on the BWB. The BWB transmission wiring design system consists mainly of a manager system that manages the wiring in the entire BWB system composed of the plurality of printed circuit boards, and a designer system that designs the wiring on each of the plurality of printed circuit boards while communicating with the manager system. The manager system presents the designer system predetermined design target values relevant to the entire BWB system. Moreover, the manager system presents the designer system the result of judgment made from design information, which is sequentially distributed from the designer system, on whether the design target values can be attained. The designer system finishes a wiring design while referencing the presented design target values and the presented result of judgment.

4 Claims, 19 Drawing Sheets

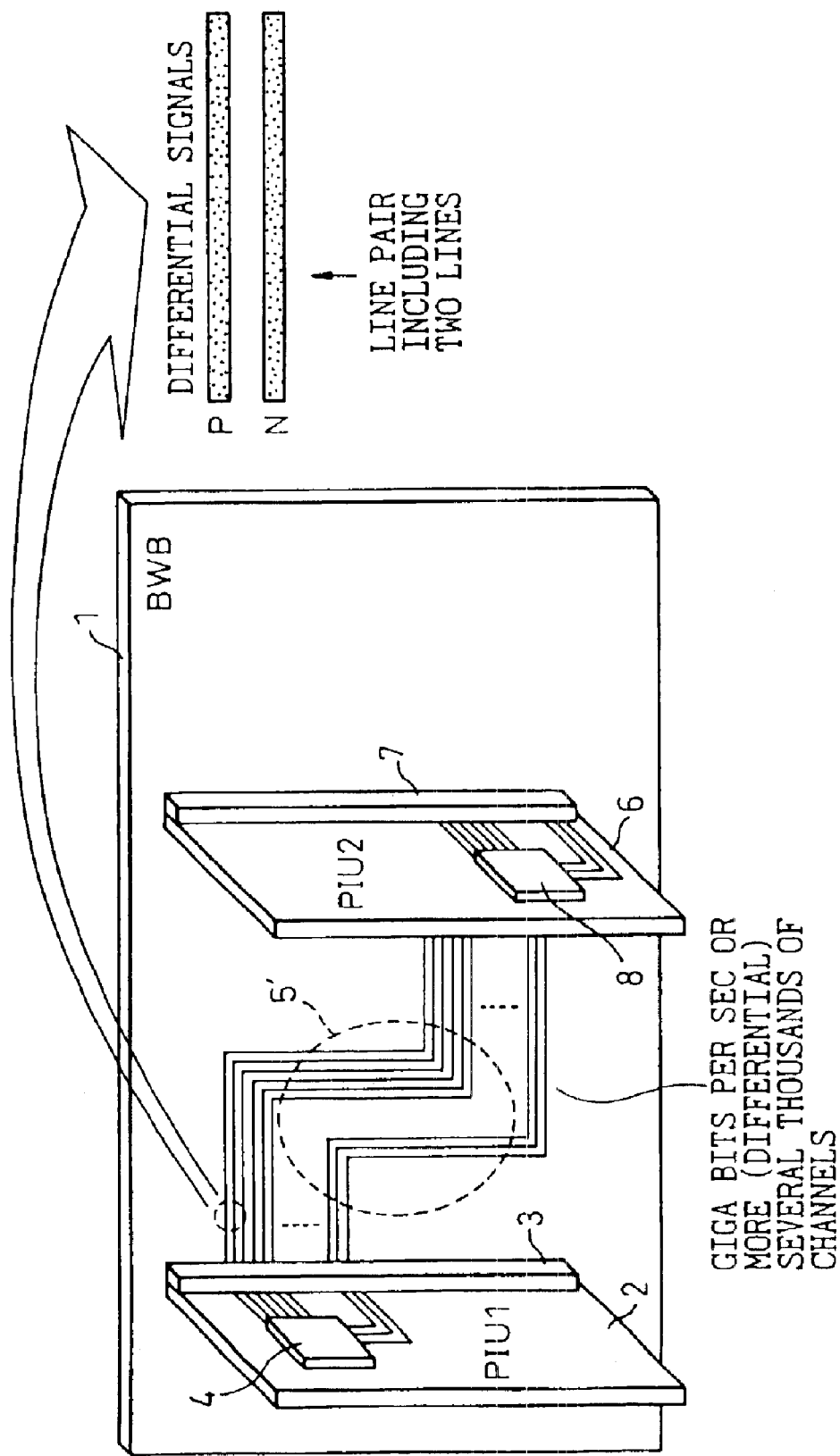

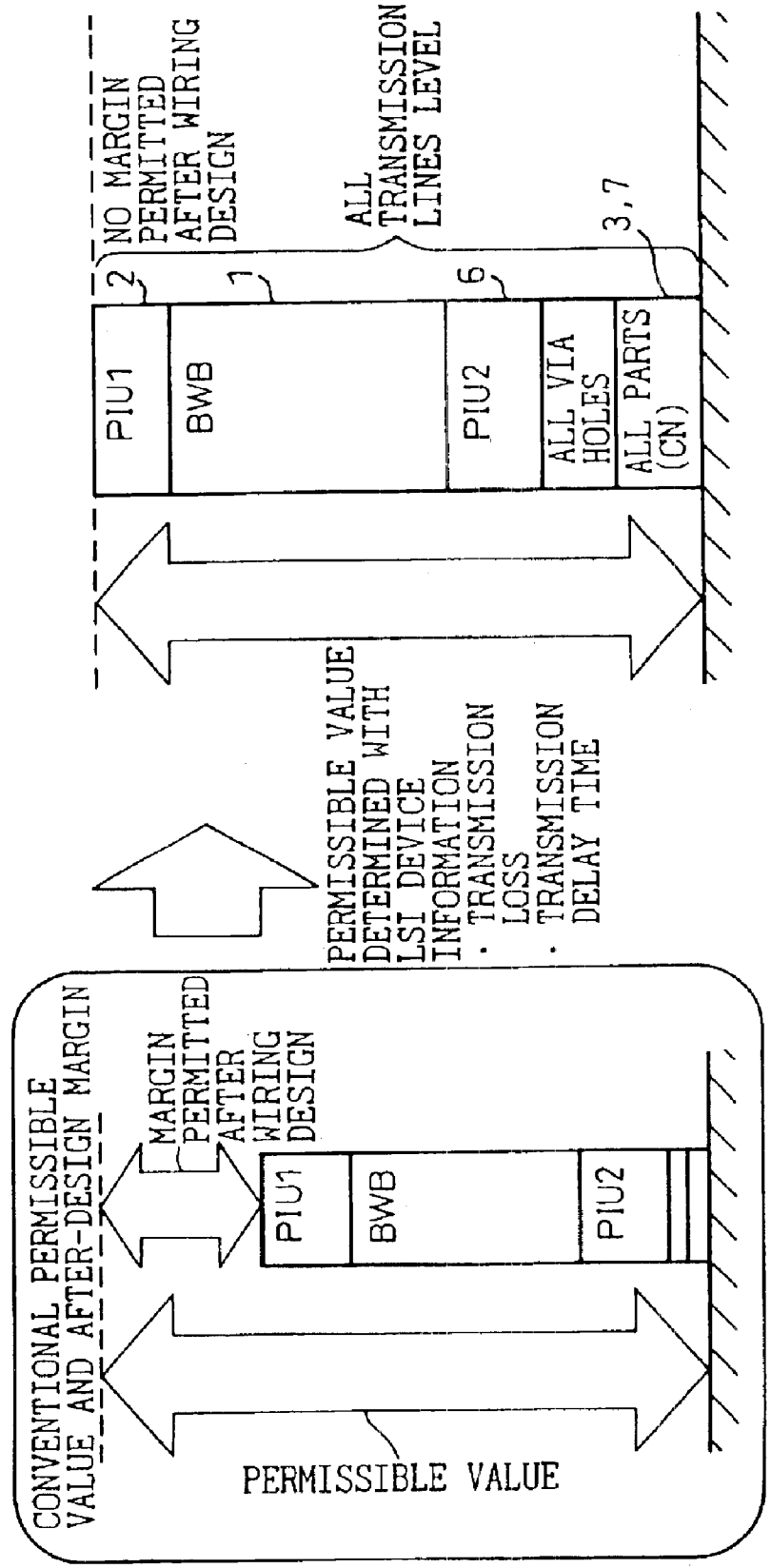

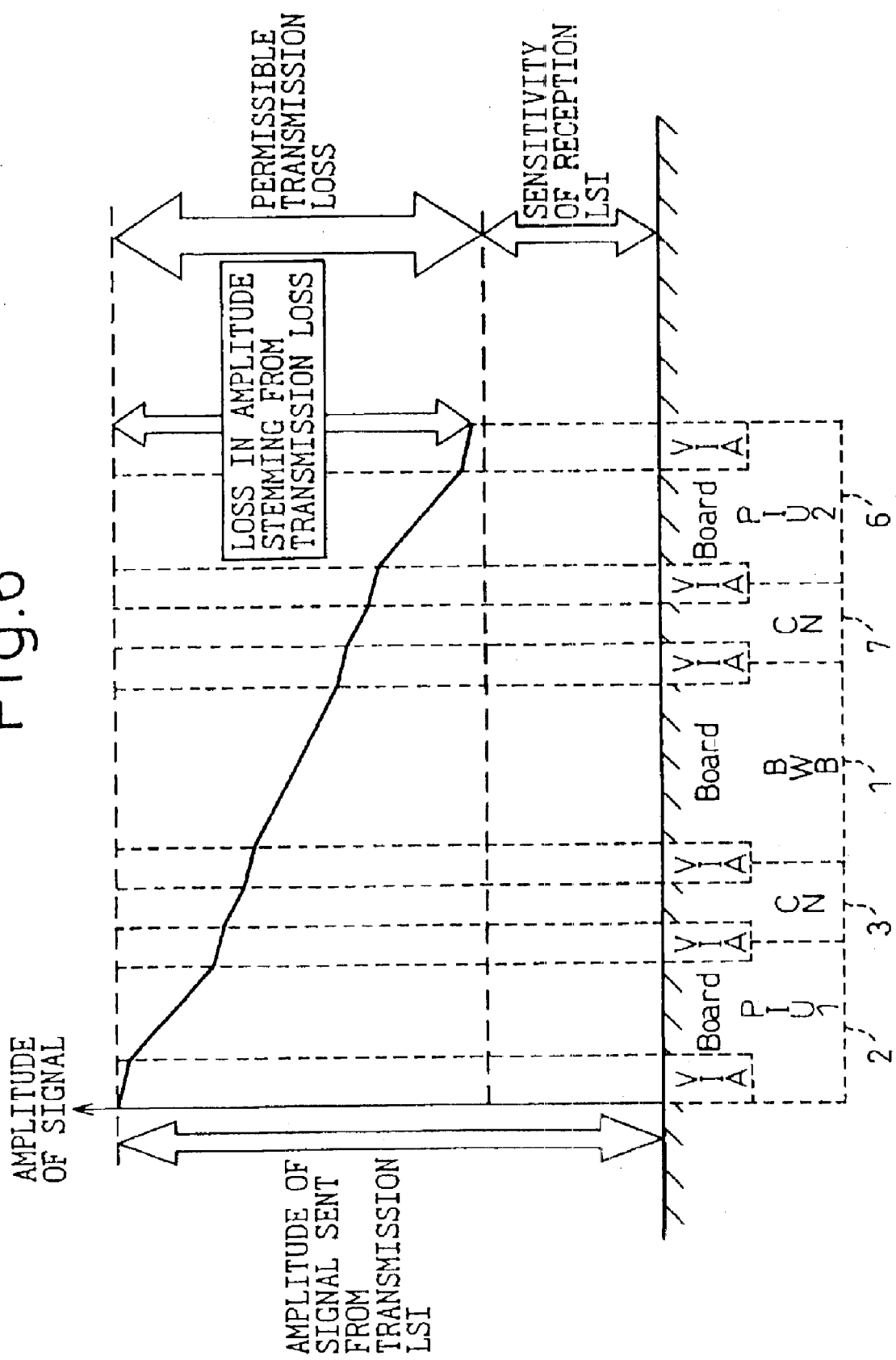

Fig.7

| LINE PAIR | ADM | | | MUX | | | BWB | | | DIFFERENCE IN DELAY TIME | | ATTENUATION LEVEL | JUDGMENT! |
|---|---|---|---|---|---|---|---|---|---|---|---|---|---|
| | LINE LENGTH | DELAY TIME | ATTENUATION LEVEL | LINE LENGTH | DELAY TIME | ATTENUATION LEVEL | LINE LENGTH | DELAY TIME | ATTENUATION LEVEL | DELAY TIME | JUDGMENT | TOTAL | |
| 141A | 55.60 | 585.40 | 1.93 + | 112.40 | 924.50 | 2.87 + | 377.29 | 2435.30 | 3.77 ↑ | 3945.20 | | 11.083 | NO GOOD! |
| 141B | 54.20 | 580.90 | 1.90 + | 111.60 | 924.40 | 2.85 + | 377.29 | 2435.30 | 3.77 ↑ | 3940.60 | 4.60 OK! | 11.027 | NO GOOD! |
| 141C | 53.60 | 571.90 | 1.89 + | 107.60 | 892.40 | 2.77 + | 377.29 | 2435.30 | 3.77 ↑ | 3899.60 | | 10.950 | OK! |
| 141D | 51.20 | 560.70 | 1.85 + | 106.80 | 892.00 | 2.76 + | 377.29 | 2435.30 | 3.77 ↑ | 3888.00 | 11.60 OK! | 10.875 | OK! |
| 141E | 47.00 | 527.40 | 1.76 + | 104.50 | 871.60 | 2.71 + | 377.29 | 2435.30 | 3.77 ↑ | 3834.30 | | 10.760 | OK! |
| 141F | 46.90 | 531.40 | 1.76 + | 103.80 | 871.70 | 2.70 + | 377.29 | 2435.30 | 3.77 ↑ | 3838.40 | 4.10 OK! | 10.729 | OK! |
| 141G | 47.80 | 533.00 | 1.78 + | 105.80 | 879.70 | 2.73 + | 377.29 | 2435.30 | 3.77 ↑ | 3848.00 | | 10.800 | OK! |
| 141H | 46.70 | 530.30 | 1.76 + | 105.00 | 879.50 | 2.72 + | 377.29 | 2435.30 | 3.77 ↑ | 3845.20 | 2.80 OK! | 10.749 | OK! |
| 142A | 32.00 | 426.20 | 1.47 + | 85.40 | 742.80 | 2.34 + | 377.29 | 2435.30 | 3.77 ↑ | 3604.30 | | 10.090 | OK! |
| 142B | 30.60 | 421.60 | 1.44 + | 84.60 | 742.60 | 2.32 + | 377.29 | 2435.30 | 3.77 ↑ | 3599.50 | 4.80 OK! | 10.035 | OK! |
| 142C | 30.60 | 416.60 | 1.44 + | 80.60 | 710.70 | 2.24 + | 377.29 | 2435.30 | 3.77 ↑ | 3562.60 | | 9.969 | OK! |
| 142D | 28.10 | 405.40 | 1.39 + | 79.80 | 710.30 | 2.23 + | 377.29 | 2435.30 | 3.77 ↑ | 3551.00 | 11.60 OK! | 9.892 | OK! |
| 142E | 28.50 | 402.70 | 1.40 + | 77.50 | 689.90 | 2.18 + | 377.29 | 2435.30 | 3.77 ↑ | 3527.90 | | 9.868 | OK! |
| 142F | 28.90 | 410.70 | 1.41 + | 76.80 | 690.00 | 2.17 + | 377.29 | 2435.30 | 3.77 ↑ | 3536.00 | 8.10 OK! | 9.849 | OK! |
| 142G | 31.40 | 422.70 | 1.46 + | 78.80 | 698.00 | 2.21 + | 377.29 | 2435.30 | 3.77 ↑ | 3556.00 | | 9.949 | OK! |
| 142H | 30.30 | 419.90 | 1.44 + | 78.00 | 697.80 | 2.19 + | 377.29 | 2435.30 | 3.77 ↑ | 3553.00 | 3.00 OK! | 9.899 | OK! |

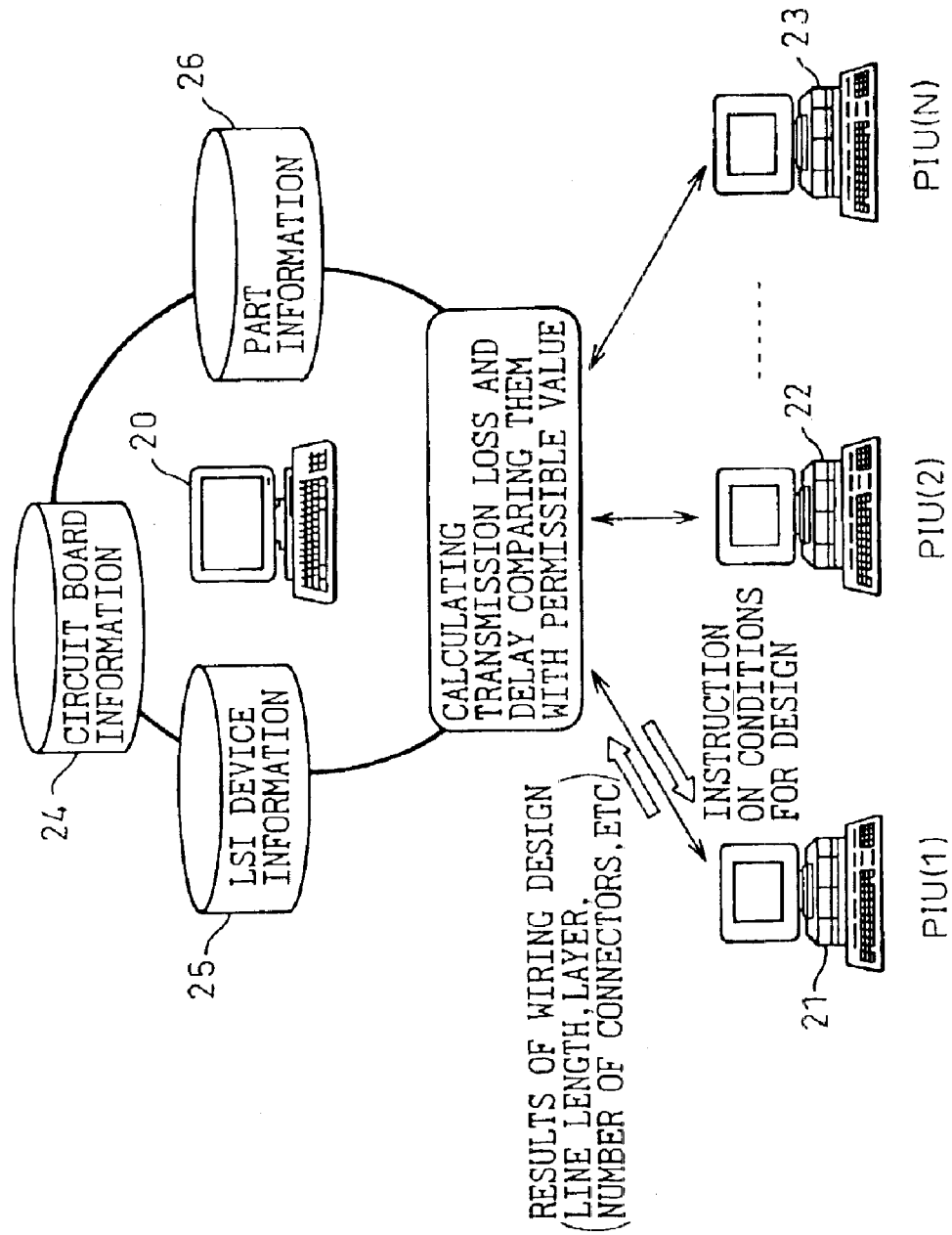

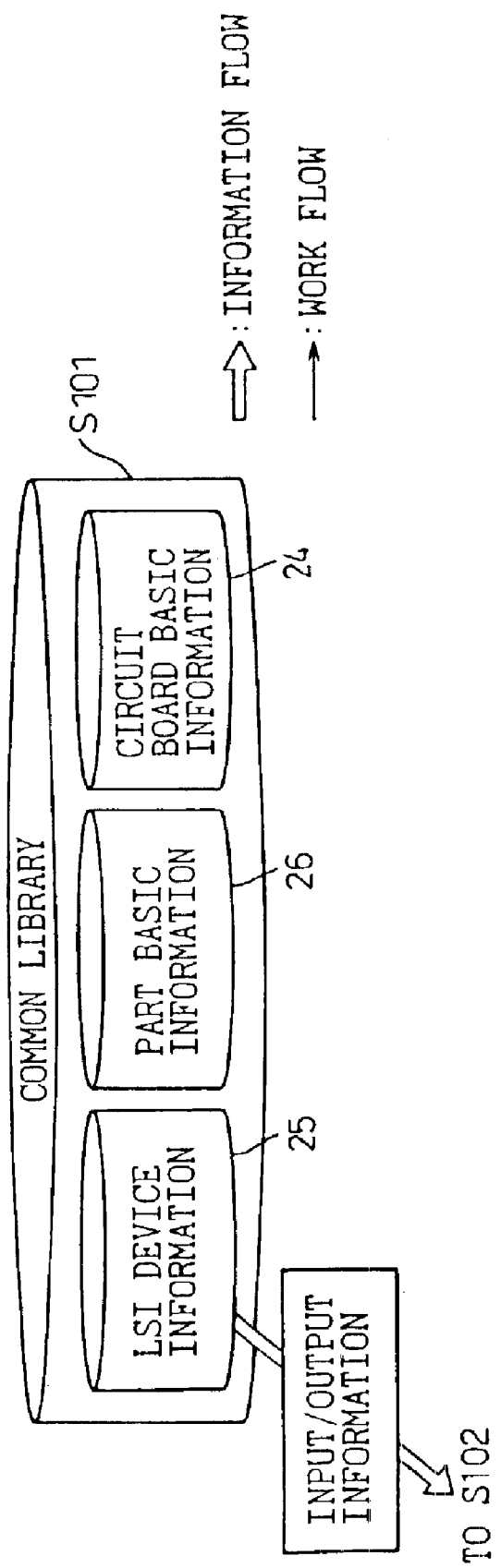

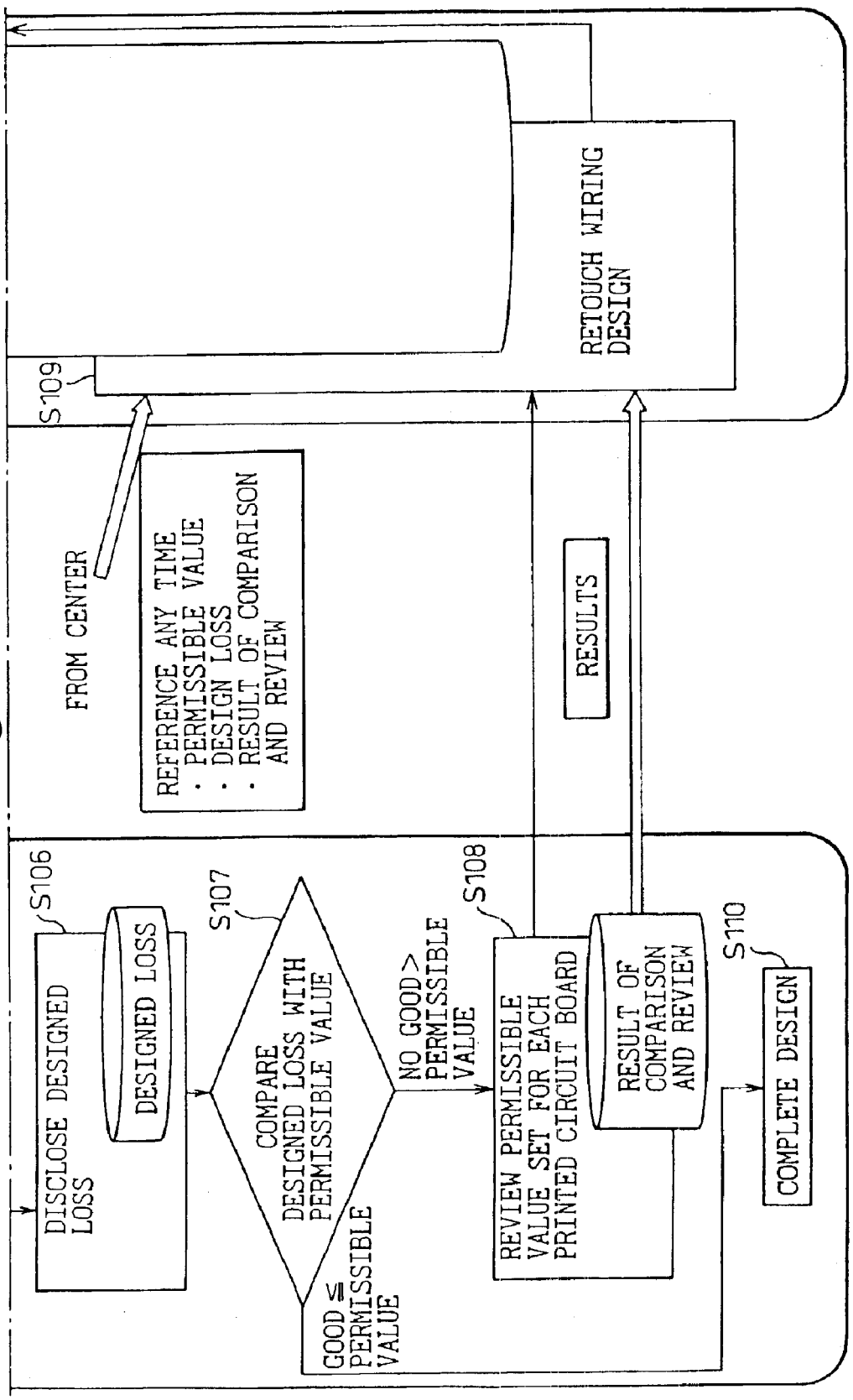

Fig.12

LSI DEVICE INFORMATION [mV]

| ITEM | LSI-A | B | C | ... |
|---|---|---|---|---|
| AMPLITUDE OF OUTPUT | 800 | 1000 | 700 | |
| SENSITIVITY TO INPUT | 200 | 300 | 150 | |
| . | | | | |
| . | | | | |

SHEET CONNECTOR PIN INFORMATION

| ITEM | CN-A | | | CN-B | | | ... |
|---|---|---|---|---|---|---|---|
| | FIRST ROW | SECOND ROW | THIRD ROW | FIRST ROW | SECOND ROW | THIRD ROW | |
| TRANSMISSION LOSS COEFFICIENT [dB/NUMBER OF CONNECTORS] | 0.45 | 0.60 | 0.8 | 0.34 | 0.56 | 0.78 | |
| TRANSMISSION DELAY TIME COEFFICIENT [ps/NUMBER OF CONNECTORS] | 150 | 175 | 300 | 120 | 180 | 240 | |
| . . | | | | | | | |

WIRING TRANSMISSION LOSS COEFFICIENT [dB/mm]

| MATERIAL | LAYERED STRUCTURE A | LAYERED STRUCTURE B | LAYERED STRUCTURE C | ... |
|---|---|---|---|---|
| FR4 | 0.021 | 0.021 | 0.025 | |
| LX | 0.001 | 0.001 | 0.015 | |
| PPE | 0.001 | 0.001 | 0.002 | |
| . | | | | |

VIA TRANSMISSION LOSS COEFFICIENT [dB/mm]

| MATERIAL | VIA-Φ0.65 | | VIA-Φ0.9 | | VIA-Φ0.13 | | ... |
|---|---|---|---|---|---|---|---|
| | TRUNK LENGTH | BRANCH LENGTH | TRUNK LENGTH | BRANCH LENGTH | TRUNK LENGTH | BRANCH LENGTH | |
| FR4 | 0.01 | 0.10 | 0.012 | 0.11 | 0.015 | 0.14 | |
| LX | 0.01 | 0.10 | 0.012 | 0.11 | 0.014 | 0.12 | |
| PPE | 0.01 | 0.10 | 0.012 | 0.11 | 0.014 | 0.12 | |

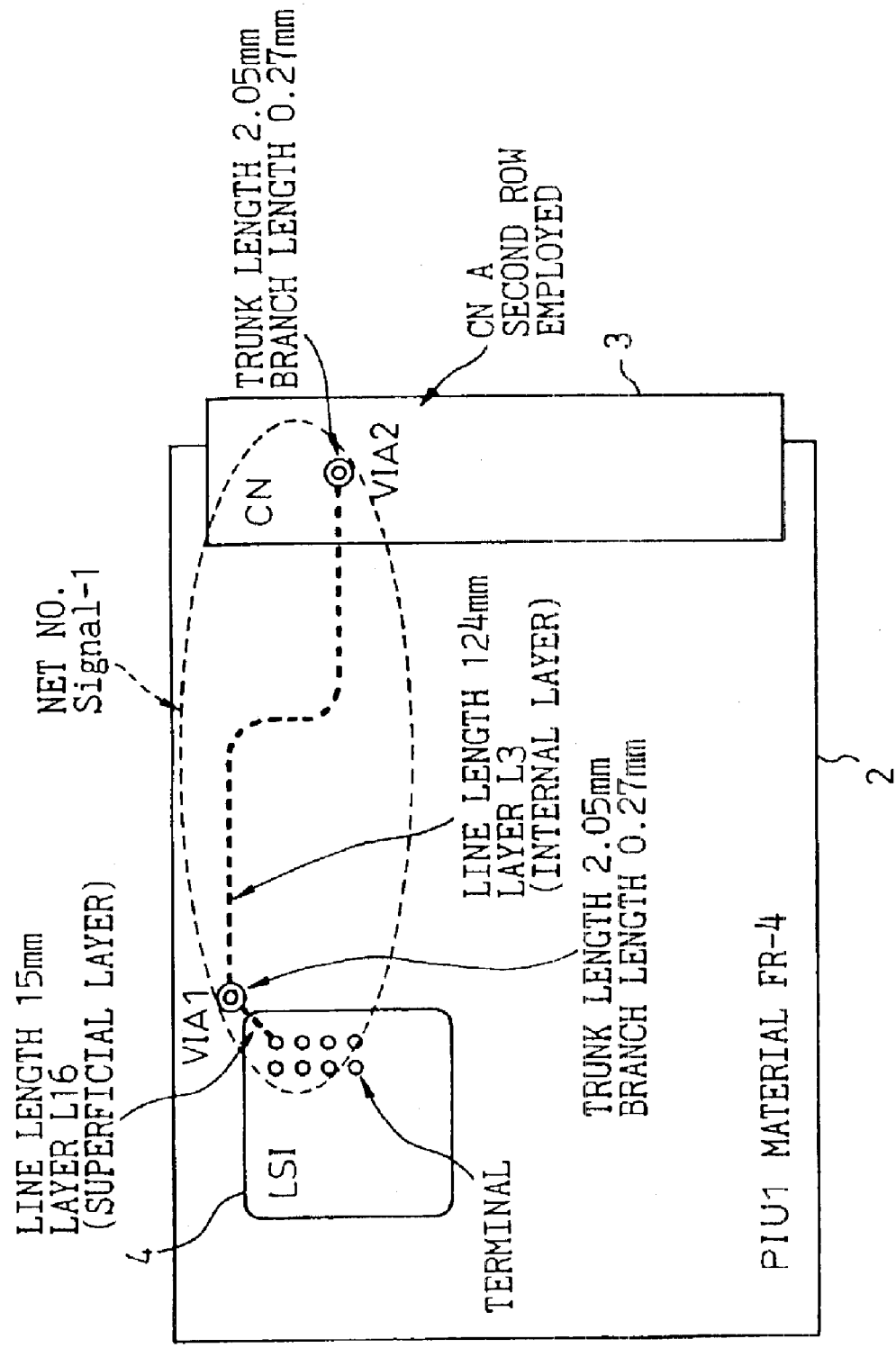

Fig.18

CLIENT 1 (IN CHARGE OF PIU 1) DESIGN INFORMATION TABLE

| PIU NAME | NET NO. | LSI INFORMATION | | | PART INFORMATION | CIRCUIT BOARD INFORMATION | | | | | | VIA INFORMATION | | | | | |
|---|---|---|---|---|---|---|---|---|---|---|---|---|---|---|---|---|---|
| | | LSI EMPLOYED | CN | ROW | LAYERED STRUCTURE | WIRING 1 | | LINE LENGTH mm | LAYERED STRUCTURE | WIRING 2 | | LINE LENGTH mm | VIA 1 | | VIA 2 | | |
| | | | | | | | LAYER | | | | LAYER/ SECTION | | TRUNK LENGTH mm | BRANCH LENGTH mm | TRUNK LENGTH mm | BRANCH LENGTH mm |
| PIU 1 | Signal -1 | LSI -A | CN -A | 2 | A | L16 | 15 | B | L3 | 124 | 2.05 | 0.27 | 2.05 | 0.27 |
| | Signal -2 | LSI -A | CN -A | 2 | A | L16 | 21 | B | L3 | 117 | 2.05 | 0.27 | 2.05 | 0.27 |
| | Signal -3 | LSI -A | CN -A | 1 | A | L16 | 12 | B | L5 | 135 | 1.85 | 0.47 | 1.85 | 0.47 |
| | Signal -4 | LSI -B | CN -A | 2 | A | L16 | 37 | B | L12 | 64 | 0.36 | 1.96 | 0.36 | 1.96 |
| | .. | | | | | | | | | | | | | |

Fig.19

COMPARISON BETWEEN PERMISSIBLE TRANSMISSION LOSSES AND DESIGNED TRANSMISSION LOSSES

| NET NO. | PERMISSIBLE VALUE [dB] | DESIGNED VALUE | | | | JUDGMENT |
| --- | --- | --- | --- | --- | --- | --- |
| | | PIU-1 | BWB | PIU | TOTAL | |
| Signal-1 | 12.04 | 3.475 | 6 | 2.525 | 12 | Good |
| Signal-2 | 12 | 2.7 | 6.5 | 2.6 | 11.8 | Good |
| Signal-3 | 12 | 2.6 | 5.2 | 3.4 | 11.2 | Good |
| Signal-4 | 12 | 3.6 | 6.4 | 2.5 | 12.5 | NG |
| Signal-5 | 12 | 3.2 | 5.5 | 2.8 | 11.5 | Good |
| Signal-6 | 10 | 2.5 | 4.8 | 3.4 | 10.7 | NG |
| Signal-7 | 10 | 2.8 | 5.3 | 2.8 | 9.9 | Good |
| Signal-8 | 10 | 3.6 | 2.1 | 3.6 | 9.3 | Good |
| Signal-9 | 13 | 3.8 | 5.5 | 1.9 | 9.2 | Good |
| Signal-10 | 13 | 2.1 | 7.2 | 2.8 | 12.1 | Good |
| Signal-11 | 13 | 5.2 | 6.1 | 6.4 | 17.7 | NG |
| . | | | | | | |
| . | | | | | | |

BWB TRANSMISSION WIRING DESIGN SYSTEM

BACKGROUND OF THE INVENTION

1. Field of the Invention

The present invention relates to a back wiring board (BWB) wiring design system. More particularly, the present invention is concerned with a BWB transmission wiring design system and with a method capable of guaranteeing the super high-speed operation of an entire system composed of a BWB and a plurality of printed circuit boards mounted on the BWB.

2. Description of the Related Art

In recent years, a data transmission speed at which data is transmitted over a transmission line and the capacity of the transmission line have increased along with an increase in the traffic on a communication channel or an increase in a channel capacity. Communication systems are therefore required to operate at a high speed and handle a large amount of data. Regarding transmission on a back wiring board (BWB) incorporated in a communication system, it has become necessary to meet a demand for transmission on several thousands of channels at a speed of 3 Gbps, in recent years. Incidentally, transmission on hundreds of channels at a speed of 600 Mpbs is demanded conventionally.

In this case, the type of signals to be transmitted on a BWB is being changed from a conventional single-ended signal (a signal at a ground potential when it is at a zero level) to two differential-mode signals (a paired signal with positive and negative phases). This is attributable to such factors as adoption of an LSI that transmits signals over a long distance at a high speed and a trend to low power consumption. Thus, the number of signal lines has been doubled.

Consequently, a printed circuit board (PCB) must be designed in consideration of the length of a printed pattern, the number of via holes, a board material, values inherent to each part, and so on, so that a transmission loss and a delay time can be managed more strictly. On the other hand, conventionally, a signal speed to be attained on a BWB and a density of lines to be formed thereon need not be strictly managed. Moreover, a single-glass-epoxy material, for example, FR-4 may be adopted as a material to be made into a printed circuit board.

Therefore, only the length of a printed pattern in a plug-in unit (PIU) or the length of a printed pattern on a BWB should be managed in order to realize desired transmission characteristics. Designing is enabled when, for example, the length of the printed pattern in the PIU falls within a range of 100 mm±20 mm, and the length of the printed pattern on the BWB falls within a range of 800 mm±20 mm.

FIG. 1 shows an example of the structure of a conventional BWB.

Referring to FIG. 1, two PIUs 2 and 6 are plugged into a BWB 1 via sheet connectors 3 and 7 respectively. A pattern of single-ended lines capable of guaranteeing a signal transmission speed of 600 Mbps has been adopted in the past.

What is referred to as the pattern of single-ended lines is such that one signal wave is allocated to each signal line and one end of each signal line is connected to a common ground. For example, when signals to which several hundreds of channels are assigned are routed on the BWB 1, the BWB 1 is provided with a signal layer in which a pattern of lines 5 corresponding to several hundreds of channels is formed and a ground layer in which a common ground is formed.

Referring to FIG. 1, a transmission LSI 4 is mounted on the PIU 2, and a reception LSI 8 is mounted on the PIU 6. Consequently, the wiring for signal line is designed in consideration of line lengths permitted to lines extended between the transmission LSI 4 on the PIU 2 and the reception LSI 8 on the PIU 6.

FIG. 2 shows an example of a margin permitted to a parameter relevant to a system including a BWB and PIUs after conventional transmission wiring design.

Assuming that a signal is transmitted at a speed of 600 Mbps as it conventionally is, a transmission loss or a transmission delay time calculated from a permissible value specified in LSI device information concerning transceivers or the like installed at both a signal transmitting end and a signal receiving end is provided with a sufficient tolerance, that is, a large margin permitted after wiring design. The tolerance, that is, the margin is permitted to the transmission loss or delay time relative to a value that must be strictly observed in designing wiring to interconnect all parts including the BWB, PIUs 1 and 2, via holes (VIA), and connectors (CN).

FIG. 3 shows an example of a conventional transmission wiring design system.

As mentioned above, conventionally, a large margin is permitted after wiring design. Therefore, unique conditions for wiring can be set for each of the BWB and PIUs, and independent transmission wiring design systems 11 to 13 can be used to design wiring under the unique conditions for wiring. In this example, a line length of 100±20 mm is permitted to wiring design for each PIU, while a line length of 800±20 mm is permitted to wiring design for the BWB. The values of the line lengths are given a sufficient after-design margin. Even if a PIU is manufactured to deviate from the specifications determined therefor, no problem occurs in the whole of a system including the BWB and PIUs.

However, when a signal transmission speed on a BWB is equal to or larger than the level of giga bits per sec, not only the line lengths but also a transmission loss or delay time caused by via holes and a transmission loss or delay time caused by a connector must be taken account. When the line lengths are managed as they conventionally are, design cannot be achieved successfully.

Moreover, in order to minimize a loss to be undergone by high-frequency signal components, a material other than the conventionally adopted FR-4, for example, a low-dielectric material must be adopted. A loss or delay time per unit length of a printed pattern is therefore different from the conventional one. Management of wiring design then becomes harder.

FIG. 4 shows an example of the structure of a BWB on which signals are transmitted at 3 Gbps.

In this example, a line pair including two lines (for signals with positive and negative phases) is used to transmit one signal. Moreover, one system accommodates several thousands of channels in conformity with a recent demand for a large channel capacity and a compact design. In this case, the number of lines on the BWB is much larger than the conventional one. Wiring design itself becomes unfeasible as long as a conventional technique is adopted.

FIG. 5 and FIG. 6 show an example of a current margin permitted to a parameter relevant to a system including a BWB and PIUs after wiring design.

Assuming that signals are transmitted at 3 Gbps, the conventional margin permitted to wiring design as shown on the left side of FIG. 5 (identical to FIG. 2) is too insufficient to achieve the wiring design. Therefore, another material is adopted as a material of manufacture printed circuit boards, that is, a low-dielectric material, for example, LX is adopted.: Nevertheless, as shown on the right side of FIG. 5, a margin permitted after wiring design is nearly nil.

FIG. 6 shows an example of transmission losses caused by parts included in a BWB and PIUs on the assumption that the low-dielectric material concerning the right side of FIG. 5 is adopted as a material of printed circuit boards. The transmission losses are detected as losses in the amplitude of a signal with respect to a difference between the amplitude of a signal transmitted from a transceiver LSI and the sensitivity of a transceiver LSI to a received signal.

As mentioned above, the conventional transmission wiring design systems shown in FIG. 3 are used to design the wiring in the PIU 1, PIU 2, and BWB respectively while the transmission wiring design systems are physically separated from one another and independent of one another. This poses a problem in that the overall operation of a system cannot satisfy a desired standard. Consequently, redesigning of the wiring in the components and subsequent checking of the overall system operation are repeated frequently. This leads to the situation of terribly inefficient development.

FIG. 7 shows an example of a table listing line lengths and delay times that are designed for the components by means of the transmission wiring design systems shown in FIG. 3.

In this example, an addition/drop multiplexer (ADX) is adopted as the PIU 1, and a multiplexer (MUX) is adopted as the PIU 2. In the drawing, group 141 refers to a group of lines 141. The group of lines 141 include line pairs 141A, 141B, 141C, 141C, etc., 141G, and 141H.

Herein, the line lengths and delay times designed independently for the ADM, MUX, and BWB are collected, and it is judged in terms of the overall system operation whether a design for each line pair is acceptable. The results of judgments are also listed. The differences in delay times and total attenuation levels are listed on the right-hand columns of the table. Herein, the "difference in delay time" refers to a difference between delay times occurring on two lines constituting each of the line pairs that form a transmission line extended throughout the system. An effective wavelength of a received differential-mode signal is regarded as the difference in delay time. Moreover, the attenuation level refers to a magnitude of attenuation occurring on each line pair spread throughout the system as shown in FIG. 6.

In the above example, the attenuation levels of the line pairs 141A and 141B are 11.083 and 11.027 (dB) respectively and are larger than those of the others. Therefore, it is judged that the designs for the line pairs are unacceptable (No good)." In this case, attenuation levels to be caused by the ADM, MUX, and BWB are re-calculated. Based on the results of calculation, wiring is redesigned for each of these components. Thus, the results of wiring design performed on the components are collected first, and it is then judged whether the design of each of numerous line pairs is acceptable. If it is judged that the design of each line pair extended throughout the system is unacceptable (No good), the transmission wiring design systems are reused to redesign the wiring in the respective components. The thus complex design process must be followed. This means that development of a BWB system is very inefficient.

SUMMARY OF THE INVENTION

Accordingly, an object of the present invention is to solve the above problems and to provide a BWB transmission wiring design system capable of designing the wiring in each component of a BWB transmission system while managing the design target values of a transmission loss and a delay time, which may occur throughout the BWB transmission system, determined based on LSI device information. The BWB transmission wiring design system can thus assist in designing a super high-speed BWB transmission system that can transmit signals at 3 Gbps.

According to the present invention, there is provided a BWB transmission wiring design system consisting mainly of: a managing means that manages the wiring in an entire BWB system composed of a plurality of printed circuit boards; and a designing means that designs the wiring on each of the plurality of printed circuit boards while communicating with the managing means. Herein, the managing means presents the designing means predetermined design target values relevant to the entire BWB system. Moreover, based on design information distributed sequentially from the designing means, the managing means presents the result of judgment made on whether the design target values can be attained. The designing means finishes a wiring design while referencing the presented design target vales and the presented result of judgment.

Furthermore, the managing means presents the designing means with a message that is helpful in attaining the design target values. Moreover, the managing means includes: an LSI information manager that manages LSI device information concerning signal transmission LSIs installed at transmitting and receiving ends of transmission lines each including signal lines formed on the plurality of printed circuit boards; a part information manager that manages part information concerning parts employed in the BWB system; and a circuit board information manager that manages circuit board information concerning printed circuit boards employed in the BWB system.

The managing means presents the designing means, as the design target values, with a permissible transmission loss and a permissible transmission delay time that occur on a transmission line concerned and that are determined based on the LSI device information. The design information distributed sequentially from the designing means, and the part information and circuit board information associated with the design information are used to calculate a designed transmission loss and a designed transmission delay time which are caused by the plurality of printed circuit boards. The designed transmission loss and designed transmission delay time are compared with the permissible transmission loss and permissible transmission delay time, whereby it is judged whether the design target values can be attained.

BRIEF DESCRIPTION OF THE DRAWINGS

The present invention will be more clearly understood from the description as set forth below with reference to the accompanying drawings.

FIG. 4 shows an example of the structure of a BWB on which signals are transmitted at 3 Gbps;

FIG. 5 shows an example of a margin permitted after wiring design performed for signal transmission at 3 Gbps;

FIG. 6 shows an example of transmission losses occurring during signal transmission at 3 Gbps;

FIG. 7 shows an example of a table listing line lengths and delay times designed by the transmission wiring design systems shown in FIG. 3;

FIG. 8 graphically shows an example of a basic configuration of a super high-speed BWB transmission wiring design system in accordance with the present invention;

FIG. 10 graphically shows (1) the flows of design information and of design work observed in the super high-speed BWB transmission wiring design system in accordance with the present invention;

FIG. 11B graphically shows (3) the flow of design information and of design work observed in the super high-speed BWB transmission wiring design system in accordance with the present invention;

FIG. 12 shows an example of LSI device information;

FIG. 17 shows a concrete example of wiring design for a PIU 1;

FIG. 18 shows an example of PIU 1 design information; and

FIG. 19 shows an example of a table listing losses on all transmission lines and the results of judgments made on the designs of the transmission lines.

DESCRIPTION OF THE PREFERRED EMBODIMENTS

Figure 1:
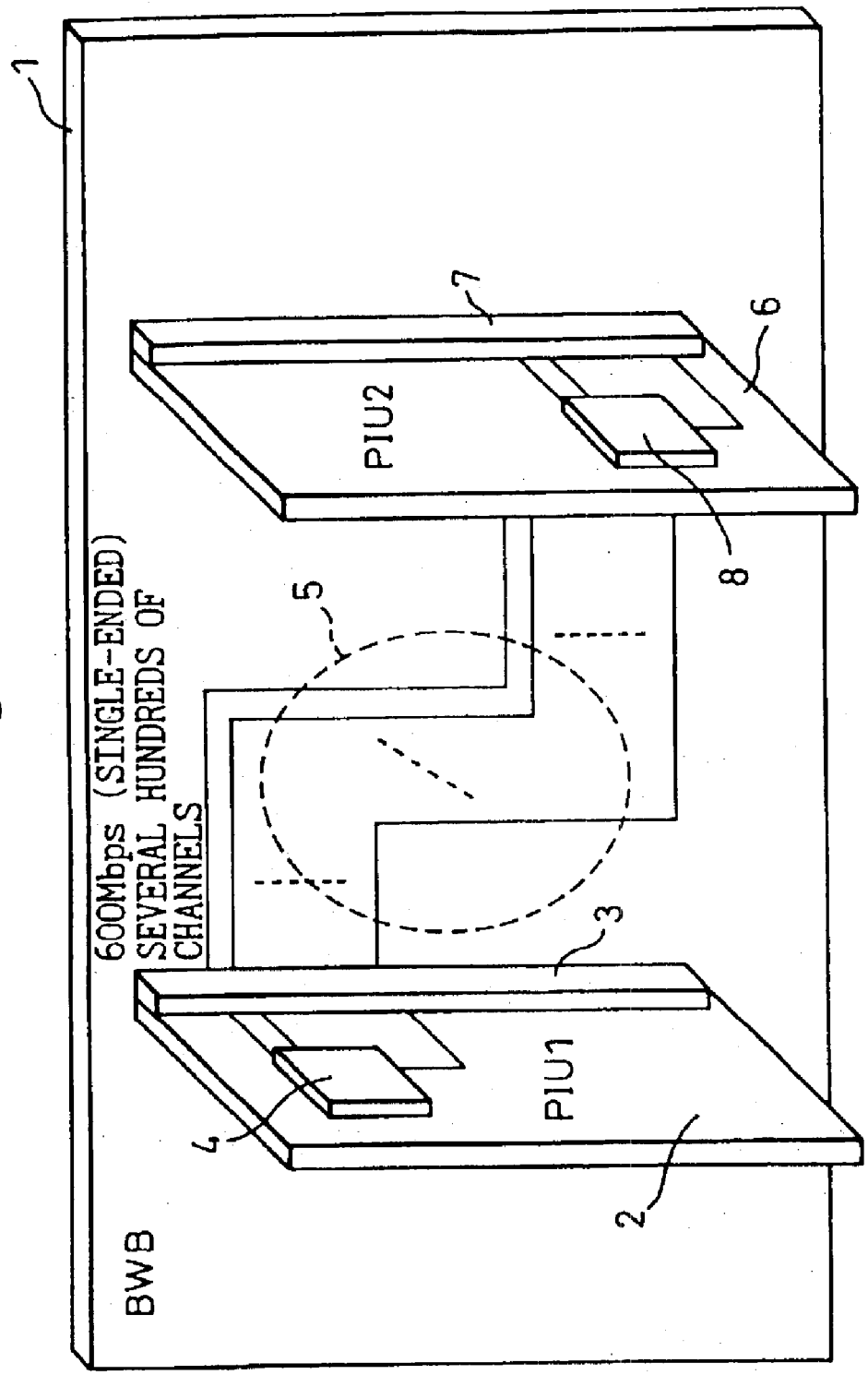
FIG. 1 shows an example of the structure of a BWB on which signals are transmitted at 600 bps.
Figure 2:
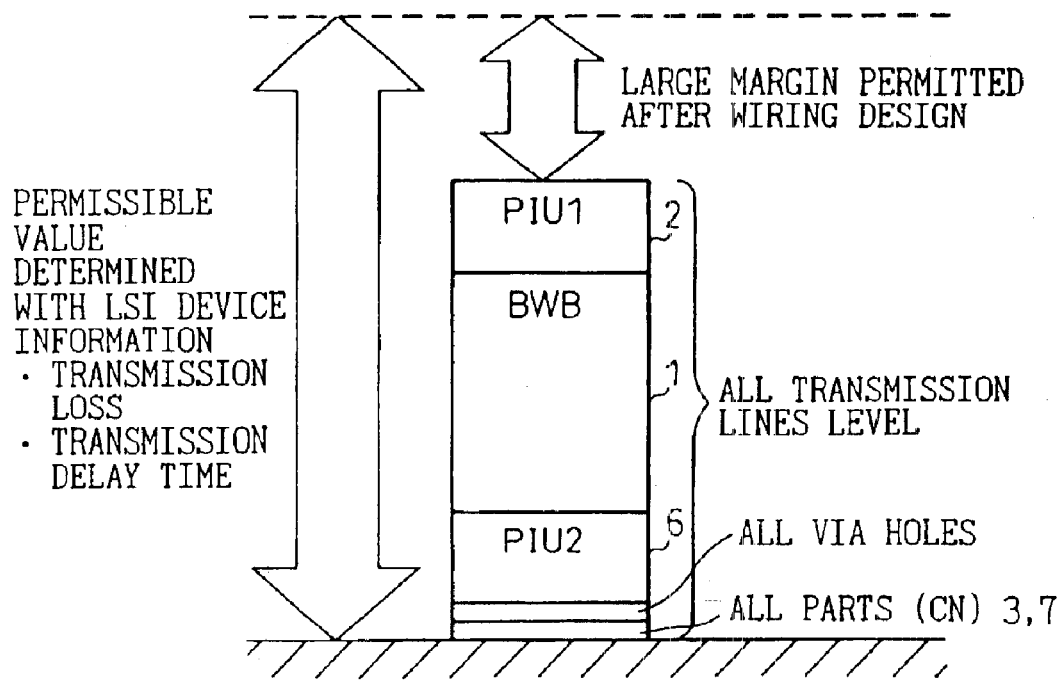
FIG. 2 shows an example of a margin permitted after wiring design performed for signal transmission at 600 bps.
Figure 3:
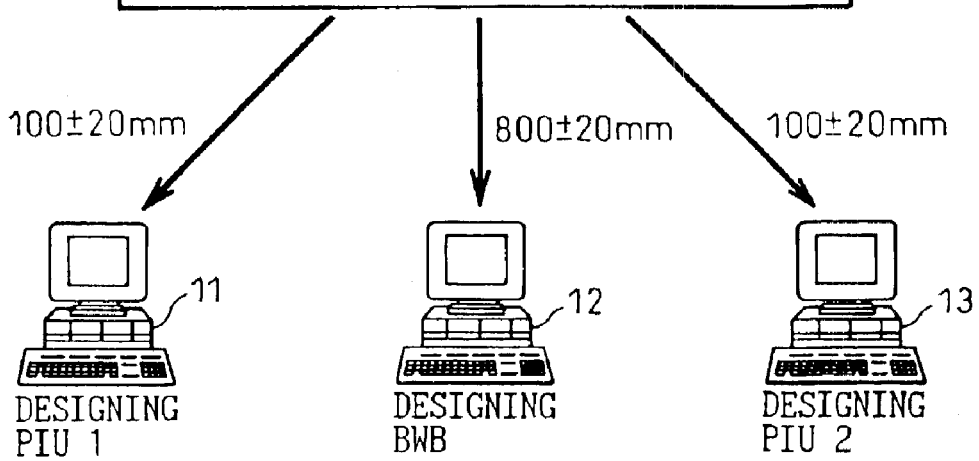
FIG. 3 shows an example of conventional transmission wiring systems.
Figure 9:
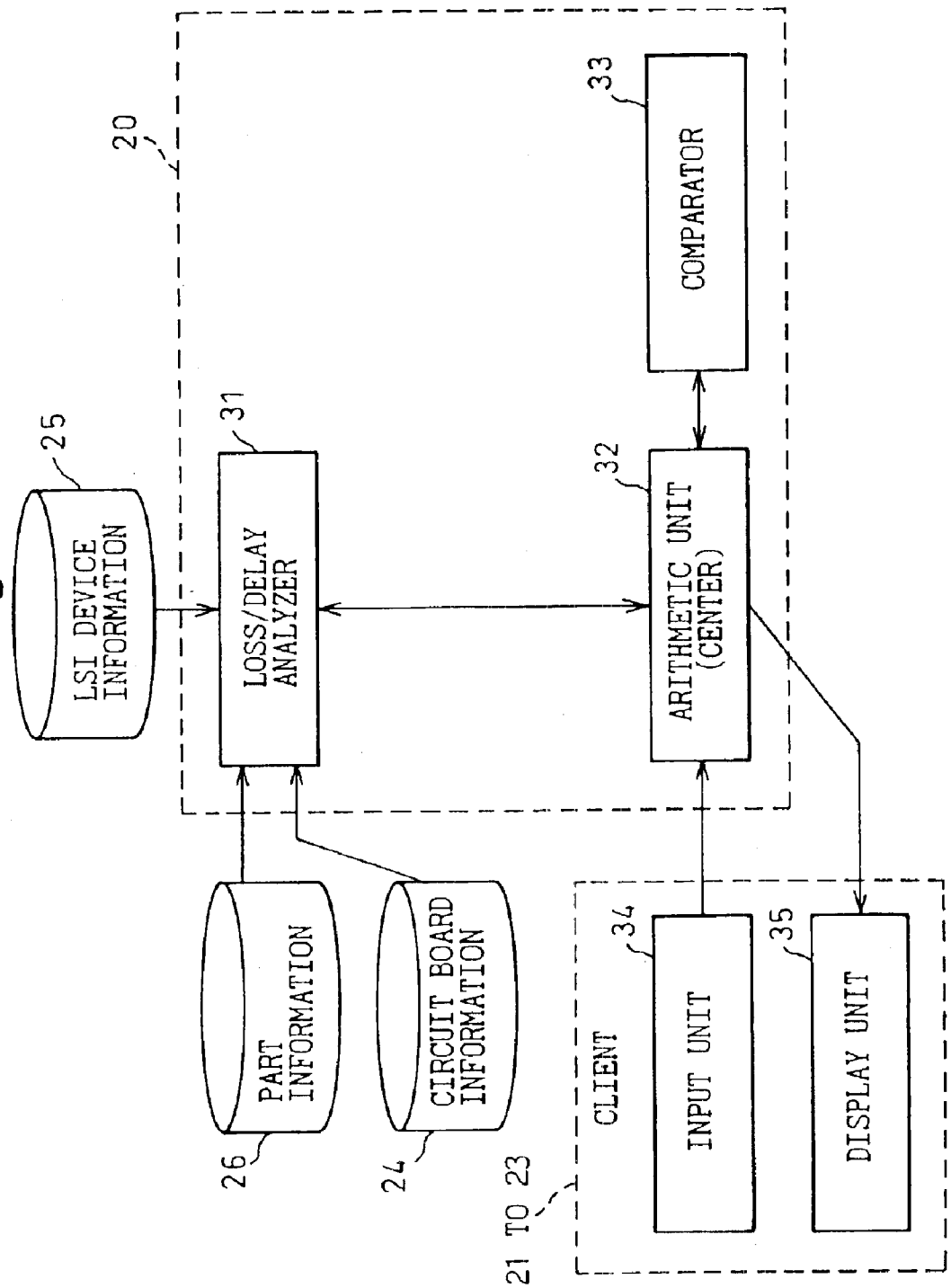
FIG. 9 is a functional block diagram showing the super high-speed BWB transmission wiring design system in accordance with the present invention.

FIG. 8 graphically shows an example of a basic configuration of a BWB transmission wiring design system in accordance with the present invention. FIG. 9 is a functional block diagram showing the BWB transmission wiring design system in accordance with the present invention.

A transmission wiring management system 20 installed at a center consists mainly of an LSI information manager 25, a circuit board information manager 24, and a part information manager 26. Transmission wiring design systems 21 to 23 installed at clients are connected to the transmission wiring management system 20 over a local area network (LAN). The LSI information manager 25 manages design target values, which are determined relative to an entire system and determined based on LSI device information, as the values of common parameters such as a transmission loss and a delay time.

The circuit board information manager 24 manages basic losses and basic delay times, which are caused by a printed pattern and via holes and varied depending on a material to be made into printed circuit boards or a layered structure, in the form of an information table. The part information manager 26 manages basic losses and basic delay times, which are varied depending on the specifications for parts included in the BWB and PIUs and the pin configuration employed, in the form of an information table.

A loss/delay analyzer 31 included in the transmission wiring management system 20 determines desired design target values by analyzing a permissible transmission loss and a permissible propagation delay, which are caused by an entire system, on the basis of information received from the LSI information manager 25, circuit board information manager 24, and part information manager 26 respectively. An arithmetic unit 32 uses the basic information received from the circuit board information manager 24 and part information manager 26 to perform arithmetic operations on current printed circuit board (PCB) design data, which is distributed sequentially from an input unit 34 included in each of the transmission wiring design systems 21 to 23. Based on the results of arithmetic operations, the arithmetic unit 32 calculates a designed transmission loss and a designed propagation delay that are currently caused by the entire system.

A comparator 33 compares the designed transmission loss and designed propagation delay with the permissible transmission loss and permissible propagation delay whose values serve as the design target values, whereby it is judged whether a signal line concerned is acceptable. The transmission wiring management system 20 reviews design elements, which have complex relations to counterparts included in other components, according to distributed current PCB design data, and thus corrects or re-sets the design target values for each component.

The arithmetic unit 32 immediately presents or discloses the result of judgment and a required instruction on the conditions for design to the transmission wiring design systems 21 to 23. Based on the presented result of judgment and the presented instruction on the conditions for designing, the transmission wiring design systems 21 to 23 proceed with on-going design work and make required modifications in due course.

As mentioned above, it is immediately revealed whether currently designed values are acceptable. The transmission wiring design systems 21 to 23 need not be conscious of the situations in which the other transmission wiring design systems are designing wiring but can finish a complete product shortly. On the other hand, the transmission wiring management system 20 provides an efficient development environment, which obviates the necessity of restarting development from the beginning, owing to common use of design information. Consequently, a feasible design for the entire system can be provided immediately.

Now, an embodiment of the present invention will be described below.

Figure 11A:
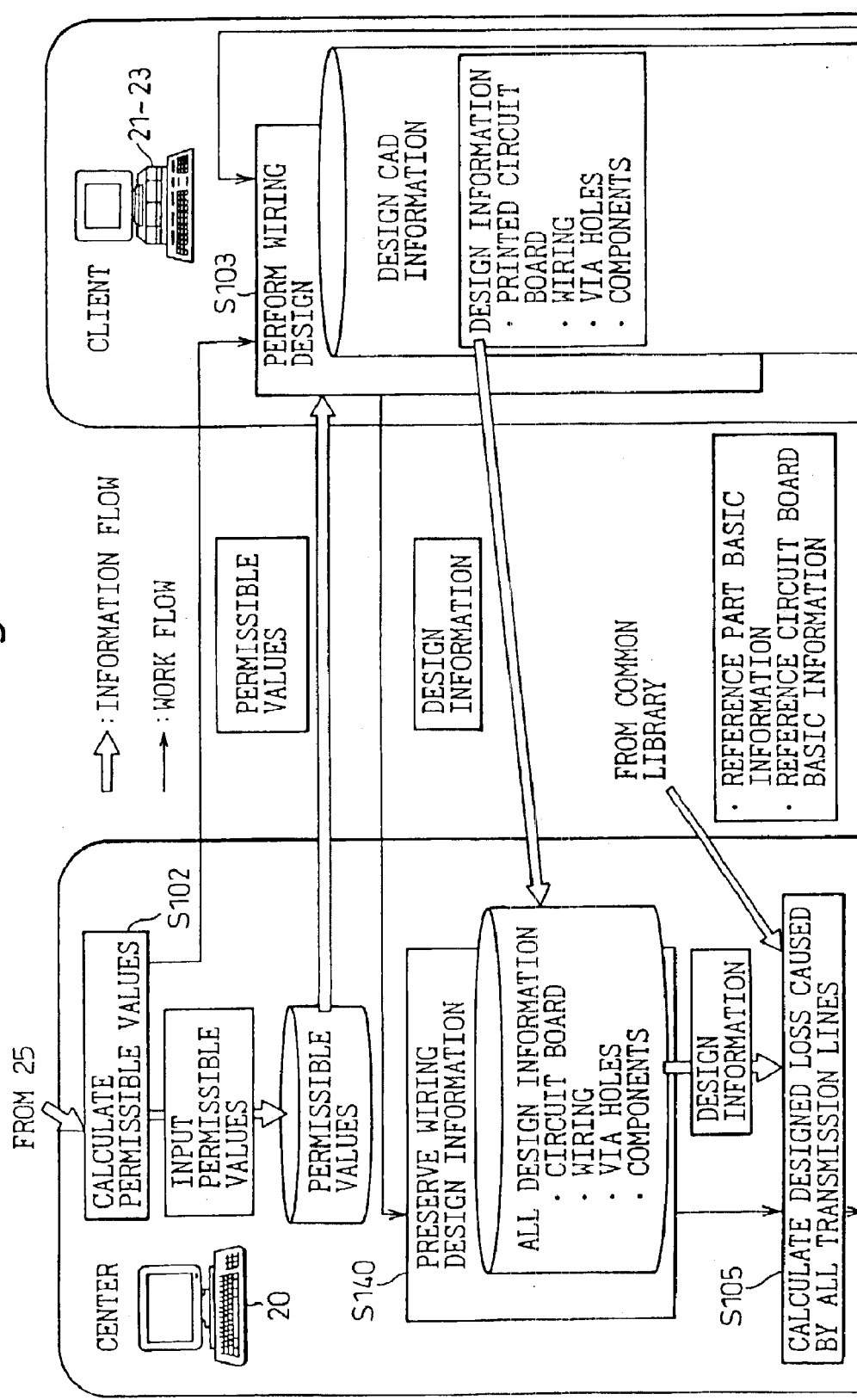
FIG. 11A graphically shows (2) the flow of design information and of design work observed in the super high-speed BWB transmission wiring design system in accordance with the present invention.

FIG. 10 and FIGS. 11A and 11B graphically show the flows of design information and of design work observed in the BWB transmission wiring design system in accordance with the present invention.

(1) First, a common library is created at step S101. Herein, basic information that specifies conversion coefficients for transmission losses is made available. The basic information falls into LSI device information 25, part basic information 26, and circuit board basic information 24. Other data is added to each information any time so that the BWB transmission wiring design system can cope with diverse requirements for design. The transmission wiring design systems 21 to 23 at the clients can, if necessary, reference the information in the common library via the transmission wiring management system 20 at the center.

FIG. 12 to FIG. 15B show concrete examples of the design information items 24 to 26. Herein, the values entered in the drawings are values set for signal transmission to be performed at 3 Gbps.

FIG. 12 shows an example of the LSI device information 25. Mainly, a differential LSI, that is, a low voltage differential (LVD) LSI is adopted as transceiver LSIs. When an LSI A is adopted, the amplifier of an output of a transmitting side is 800 mV, and the sensitivity of a receiving side to an input is 200 mV. Consequently, when the LSI A is adopted, a voltage attenuation level permitted to the input and output is 600 mV.

Figures 13A, 13B:
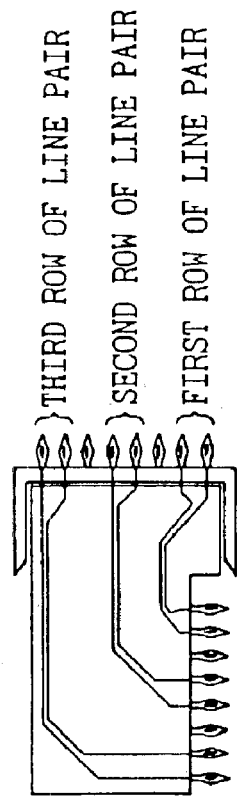
FIG. 13A shows an example (1) of part basic information.
FIG. 13B shows an example (2) of part basic information.

FIG. 13A and FIG. 13B show examples of the part basic information 26. The examples are concerned with a sheet connector (CN) that is a component present on a transmission line. FIG. 13A shows an example of a table listing transmission losses and transmission delay times undergone by a signal that passes through the sheet connector (CN). FIG. 13B shows an example of the internal wiring of the sheet connector. For example, when a sheet connector (CN) A is adopted, a transmission loss undergone by a signal passing over a line pair of the first row is 0.45 dB, and a transmission delay time undergone thereby is 150 ps. Incidentally, the line pairs shown in FIG. 13B are arranged so that the line lengths of two lines belonging to each line pair will be equal to each other.

Figures 14A, 14B:
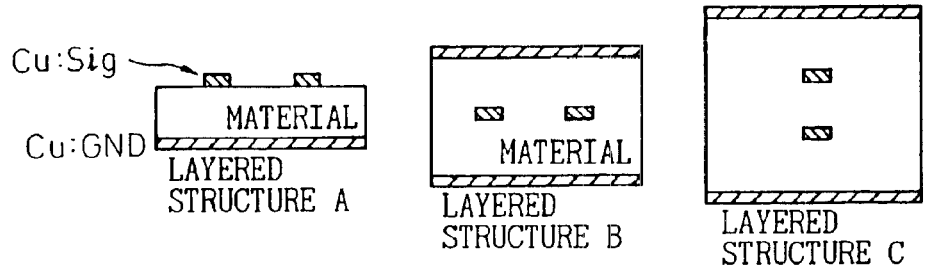
FIG. 14A shows an example (1) of circuit board basic information.
FIG. 14B shows an example (2) of circuit board basic information.

FIG. 14A and FIG. 14B show an example of the circuit board basic information 24. The circuit board basic information 24 specifies the conditions for wiring including layered structures and via holes, and transmission characteristics in relation to materials to be made into printed circuit boards. FIG. 14A indicates the relationship between the materials and the layered structures. FIG. 14B shows the sections of printed circuit boards having the layered structures listed in FIG. 14A. For example, when a low-dielectric material LX is adopted as the material, if a line pair formed in a layered structure A is adopted, a wiring transmission loss coefficient is 0.001 dB/mm. In this case, a loss of 0.001 dB occurs at intervals of 1 mm.

Figures 15A, 15B:
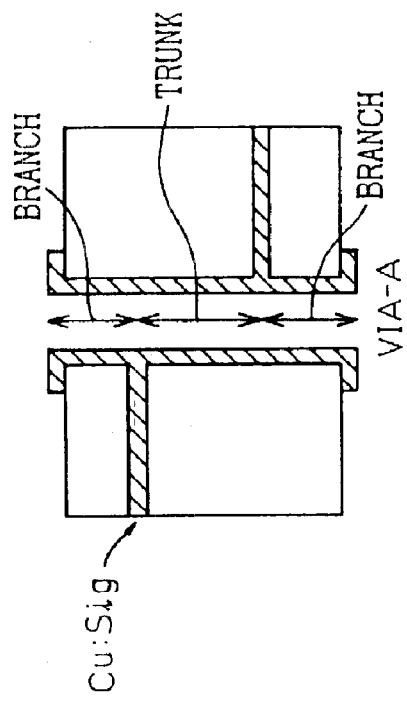
FIG. 15A shows another example (1) of circuit board basic information.
FIG. 15B shows another example (2) of circuit board basic information.

FIG. 15A and FIG. 15B are concerned with via holes. FIG. 15A indicates the relationship between the materials and via holes. FIG. 15B shows the trunk of a via hole listed in FIG. 15A and the branches thereof. For example, when a low-dielectric material LX is adopted as the material, if a via hole whose diameter is 0.65 mm is adopted, a VIA transmission loss coefficient for the trunk length of the via hole is 0.01 dB/mm.

(2) At step S102, permissible values are determined. At this time, the transmission wiring management system 20 calculates a transmission line permissible loss dependent on an LSI device, which is included in a developed system, according to information specified in the LSI device information 25 (see FIG. 12). Herein, when an LSI A is adopted as the LSI device, the transmission line permissible loss is calculated as follows:

Transmission line permissible loss [dB]

=20 Log (sensitivity to input [mV]

/amplitude of output [mV])

Herein, as the sensitivity to an input is 200 mV and the amplitude of an output is 800 mV, the transmission line permissible loss is calculated as 12.04 dB. The calculated permissible value is recorded as a "permissible transmission loss" in a permissible value library, and then reported to the clients. The permissible value can be referenced at the transmission wiring design systems 21 to 23 so that it will serve as reference information helpful in wiring design work.

(3) At step S103, the transmission wiring design systems 21 to 23 at the clients design wiring. At this time, the wiring on the printed circuit boards included in the associated PIUs and BWB is designed based on the reported permissible transmission loss. In actual wiring design, the characteristics of a complete product dependent on an adopted material such as a low-dielectric material, a layered structure (including a thickness), line lengths, the positions of via holes, and the properties of adopted parts including a sheet connector are determined in consideration of the entire system to be developed.

(4) At step S104, the wiring design information is preserved in the transmission wiring management system 20 at the center. The wiring design information in the transmission wiring design systems 21 to 23 is sequentially distributed to the transmission wiring management system 20 even in the course of designing, and preserved as actual wiring design information. Moreover, the transmission wiring design systems 21 to 23 distribute design information to the center even if the design that is in progress is partly uncertain.

For example, if an actual line length for a part positioned is uncertain, a Manhattan length is adopted and distributed as the line length. If the specifications for via holes and a layer to which the via holes conducts electricity are uncertain or if the number of rows of line pairs in a sheet connector is uncertain, a maximum value or a default value is distributed. Information preserved in the center can be referenced at the transmission wiring design systems 21 to 23 even during wiring design work so that the information will help wiring design.

Figure 16:
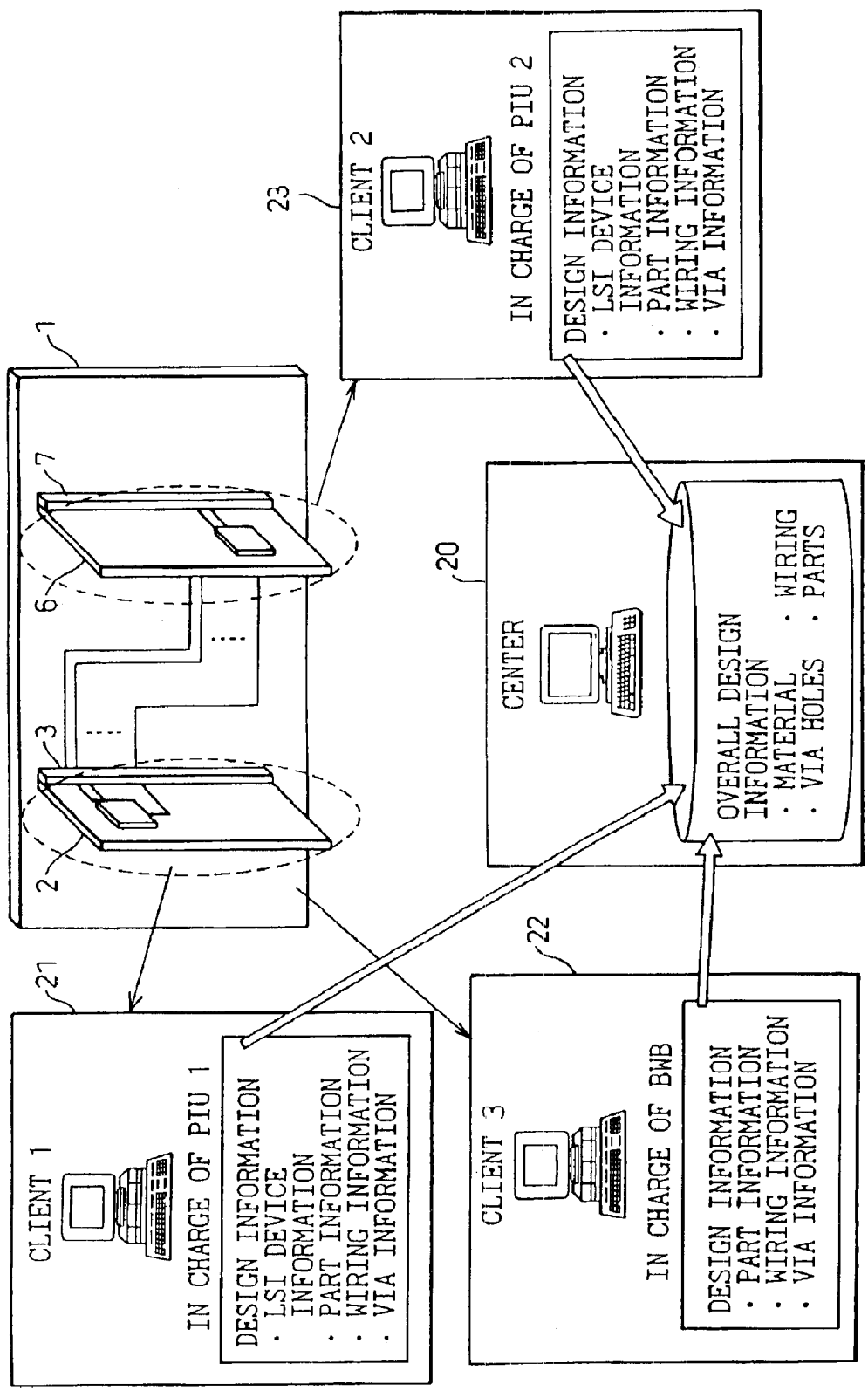
FIG. 16 shows an example of distribution of design information.

FIG. 16 to FIG. 18 graphically show examples of wiring design and distribution of design information which are performed by the transmission wiring design systems 21 to 23.

FIG. 16 shows an example of distribution of design information. Herein, the transmission wiring design system 21 at the client designs the wiring in the PIU 1, the transmission wiring design system 22 designs the wiring in the BWB, and the transmission wiring design system 23 designs the wiring in the PIU 2.

The transmission wiring design systems 21 to 23 start designing the wiring on associated printed circuit boards using the permissible transmission loss reported first from the center. The resultant design information is sequentially distributed to the transmission wiring management system 20 at the center. For example, the transmission wiring design system 22 distributes part information, wiring information, and via hole information as the design information concerning the BWB. The transmission wiring management system 20 sorts and preserves the received information as overall design information.

FIG. 17 shows a concrete example of wiring design for the PIU 1 which is performed by the transmission wiring design system 21. FIG. 18 shows an example of PIU 1 design information resulting from the wiring design. FIG. 17 shows wiring information (Net No. Signal 1) concerning a line linking the transmission LSI 4 and sheet connector 3. The wiring information items are listed in a row of Net No. Signal 1 in a PIU 1 design information table shown in FIG. 18.

For example, an LSI adopted as the transmission LSI 4 is an LSI A, and a connector adopted as the sheet connector 3 is a connector A including two rows of line pairs. A line 1 linking the transmission LSI 4 and a via hole (VIA) 1 lies in a layer L6 (superficial layer), and has a line length of 15 mm. A line 2 linking the via hole (VIA) 1 and a via hole (VIA) 2 lies in a layer L3 (internal layer), and has a line length of 124 mm. The trunks of the via holes 1 and 2 have a length of 2.05 mm, and the branches thereof have a length of 0.27 mm. The wiring information concerning the lines over which a signal Net No. Signal 1 is transmitted is distributed as PIU 1 design information to the center.

(5) At step S105, the transmission wiring management system 20 at the center calculates a designed transmission loss. The transmission wiring management system 20 collects design information concerning all parts included in the PIUs and BWB from the distributed design information and the information retrieved from the common library. The transmission wiring management system 20 then calculates as a "designed transmission loss" a transmission loss occurring on the total length of a transmission line extended on all the printed circuit boards. The timing of calculating a transmission loss is performed for every reception of distributed design information. A loss derived from the latest design is calculated all the time. The calculation of the transmission loss is performed relative to all transmission lines over which signals bearing net numbers (Net No. xxxx) are transmitted.

The designed transmission loss occurring over the total line length of a transmission line including the signal lines on all the printed circuit boards is calculated as mentioned above. Consequently, if the permissible transmission loss is equal to or larger than the designed transmission loss, design is completed. On the contrary, if the permissible transmission loss falls below the designed transmission loss, a notification saying that a wiring design should be modified is issued to the clients.

A loss occurring over the total length of a transmission line is calculated as presented below. The center calculates the loss as the designed transmission loss.

Loss over the total length of a transmission line

[dB]=PIU1 loss+BWB loss+PIU2 loss

PIU 1 loss [dB]=line loss+via hole loss+ connector loss where

Line loss [dB]=total line length on superficial layer [mm]×superficial layer loss coefficient [dB/mm]+ total line length on internal layer [mm]×internal layer loss coefficient [dB/mm]

Via hole loss [dB]=via hole 1 trunk length [mm]× via hole trunk length loss coefficient [dB/mm]+via hole

1 branch length [mm]×via hole branch length loss coefficient [dB/mm]+via hole 2 trunk length [mm]×via hole trunk length coefficient [dB/mm]+via hole 2 branch length [mm]×via hole branch length loss coefficient [dB/mm]

Connector loss [dB]=number of used connectors× used connector (rows) loss coefficient [dB/number of connectors]

A loss over the total length of a transmission line is calculated by summing up the losses caused by the printed circuit boards associated with the transmission wiring design systems 21 to 23. Hereinafter, a concrete example of calculation of a loss that occurs over the total length of a signal line in the PIU 1 over which a signal of Net No. Signal 1 is transmitted is presented below. Noted is that the values assigned to the expressions below are those listed in FIG. 13A to FIG. 15B.

First, a line loss, a via hole loss, and a connector loss are calculated.

Line loss [dB]=total line length on superficial layer 15 mm×superficial layer loss coefficient 0.02 dB/mm+total line length on internal layer 124 mm× internal layer loss coefficient 0.02 dB/mm=2.78 dB

Via hole loss [dB]=via hole 1 trunk length 2.05 mm× via hole trunk length loss coefficient 0.01 dB/mm+via hole 1 branch length 0.27 mm×via hole branch length loss coefficient 0.10 dB/mm+via hole 2 trunk length 2.05 mm×via hole trunk length loss coefficient 0.01 dB/mm+via hole branch length 0.27 mm×via hole branch length loss coefficient 0.10 dB/mm=0.095 dB Connector loss [dB]=number of used connectors 1× used connector (rows) loss coefficient 0.6 dB/number of connectors=0.6 dB

Consequently, the loss caused by the PIU 1 is calculated as the total sum of the line loss, via hole loss, and connector loss, that is, 3.475 dB. Likewise, losses undergone by the signal of Net No. Signal 1 on the signal lines included in the BWB and PIU 2 that are associated with the other transmission wiring design systems out of the transmission wiring design systems 21 to 23 are calculated. All the losses are then summed up, whereby a loss occurring on the total length of a transmission line is worked out.

FIG. 19 shows an example of designed transmission losses calculated as mentioned above, and an example of results of judgments made by comparing the designed transmission losses with the permissible transmission losses.

For example, as mentioned above, the loss which the signal of Net No. Signal 1 undergoes in the PIU 1 is 3.475 dB. Moreover, the loss undergone by the signal in the BWB is 6 dB, and the loss undergone thereby in the PIU 2 is 2.525 dB. Therefore, the designed transmission loss undergone by the signal of Net No. Signal 1 is 12 dB that is the sum of the above values. In this case, the designed transmission loss is smaller than the permissible transmission loss of 12.04 dB. Consequently, the result of judgment is acceptable or Good.

(6) Thereafter, at step S106, the designed transmission losses calculated so far are disclosed. The transmission wiring management system 20 at the center allows the clients to reference the above designed transmission losses using the transmission wiring design systems 21 to 23 any time. The disclosed information is updated to the latest every time calculation is performed.

(7) At step S107, the permissible transmission loss and designed transmission loss are compared with each other in order to make a judgment. The transmission wiring management system 20 compares a calculated designed transmission loss with an initially set permissible transmission loss so as to judge whether a wiring design concerned is acceptable or unacceptable, or in other words, Good or No good. The comparison is performed relative to all signals bearing all the net numbers (Net No. xxxx) (see FIG. 19).

(8) At step S108, the permissible value set for each printed circuit board is reviewed based on the calculated information. When the result of comparison between a designed value and a permissible value is reported to the transmission wiring design systems 21 to 23, the wiring designs for the printed circuit boards and a plan to modify a design are presented at the same time. For example, a message saying "Reduce the current loss XX dB, which is caused by the printed circuit board you are in charge of, down to YY dB." or "Modify the pin configuration of the connector to change the line pair of the first row to the line pair of the second row." is displayed on the display panel of an associated one of the transmission wiring design systems 21 to 23.

(9) At step S109, the transmission wiring design systems 21 to 23 at the clients each retouch a wiring design according to the reported result of comparison or the reported plan to modify a design. The transmission wiring design systems 21 to 23 each retouch or modify a wiring design according to a designed transmission loss that can be referenced by accessing the center or according to an instruction issued from the center. This work is continued until the designed transmission loss meets a criterion based on the permissible transmission loss and no instruction comes from the center.

(10) At step S110, design is completed. That is to say, when the transmission wiring management system 20 at the center judges at step S109 that the designed transmission loss meets the criterion based on the permissible loss and that any other modification is unnecessary, design is completed.

As described above, according to the present invention, common target values (transmission loss and delay time) are determined as parameter values relevant to an entire BWB system. A part information database and a circuit board information database and the designed states of printed circuit boards (length of a printed pattern, number of via holes, a used row in a connector, etc.) are used to calculate a transmission loss and a delay time. The calculated transmission loss and delay time are compared with the target values from time to time. Design thus proceeds. This results in the very high-speed BWB system capable of transmitting signals at 3 Gbps on 1000 channels. Incidentally, a BWB system capable of transmitting signals at 3 Gbps on 1000 channels cannot be designed according to any conventional technique.

Moreover, design information concerning printed circuit boards, design information concerning an entire system (whether a margin relative to a requested value is present), and the designed states of the printed circuit boards relative to the entire system are shared by transmission wiring design systems installed at clients. Consequently, an efficient development environment that obviates the necessity of resuming development from the beginning can be provided. A feasible design for the entire system can be provided quickly.

What is claimed is:

1. A back wiring board (BWB) transmission wiring design system having a managing means that manages the wiring in an entire BWB system composed of a plurality of printed circuit boards, and a designing means that designs the wiring on each of the plurality of printed circuit boards while communicating with said managing means, wherein:

said managing means presents said designing means with a predetermined overall design target value of the permissible transmission loss relevant to the entire BWB system, and also presents a result of judgment made from design information, which is distributed from said designing means, on whether the overall design target value can be attained; and said designing means completes a wiring design while referencing the presented overall design target values and the presented result of judgment;

wherein said managing means presents said designing means with a message helpful in attaining the overall design target value.

2. A BWB transmission wiring design system according to claim 1, wherein: said managing means includes an LSI device information manager that manages LSI device information concerning signal transmission LSIs installed at transmitting and receiving ends of transmission lines each including signal lines formed on the plurality of printed circuit boards; and said managing means presents said designing means, as the overall design target value, with a permissible transmission loss that is permitted to occur on the transmission line and that is determined based on the LSI device information.

3. A BWB transmission wiring design system according to claim 2, wherein: said managing means further includes a part information manager that manages part information concerning parts employed in said BWB system, and a circuit board information manager that manages circuit board information concerning printed circuit boards employed in said BWB system; the design information distributed from said designing means, and the part information and circuit board information associated with the design information are used to calculate a designed transmission loss that is caused by all of the plurality of printed circuit boards; and the designed transmission loss is compared with the permissible transmission loss in order to judge whether the overall design target value is attained.

4. A BWB transmission wiring design system according to claim 3, wherein said LSI information manager, part information manager, and circuit board information manager each collect, in real time, design information sequentially distributed from said designing means, and thus, if necessary, update information any time.

* * * * *